United States Patent
Kim et al.

(10) Patent No.: US 11,240,918 B2
(45) Date of Patent: Feb. 1, 2022

(54) METHOD FOR FLIP-CHIP BONDING USING ANISOTROPIC ADHESIVE POLYMER

(71) Applicant: Research & Business Foundation Sungkyunkwan University, Suwon-si (KR)

(72) Inventors: Tae Il Kim, Pyeongtaek-si (KR); Ju Seung Lee, Suwon-si (KR)

(73) Assignee: Research and Business Foundation Sungkyunkwan University, Suwon-si (KR)

( * ) Notice: Subject to any disclaimer, the term of this patent is extended or adjusted under 35 U.S.C. 154(b) by 0 days.

(21) Appl. No.: 16/553,212

(22) Filed: Aug. 28, 2019

(65) Prior Publication Data

US 2020/0077523 A1    Mar. 5, 2020

(30) Foreign Application Priority Data

Aug. 28, 2018  (KR) .................. 10-2018-0101594
Aug. 5, 2019   (KR) .................. 10-2019-0095118

(51) Int. Cl.
*H05K 1/11*    (2006.01)
*H05K 3/32*    (2006.01)
(Continued)

(52) U.S. Cl.
CPC .............. *H05K 3/323* (2013.01); *C09J 11/04* (2013.01); *C09J 201/00* (2013.01); *H05K 1/11* (2013.01);
(Continued)

(58) Field of Classification Search
CPC ....... C09J 2203/326; C09J 4/00; H05K 3/323; H05K 2203/0278; H05K 2201/0215; H05K 1/0373; H01L 24/29; H01L 2224/29499; H01L 2224/2929; H01L 2224/29364; H01L 2224/27003; H01L 2924/15788; H01L 2224/27005; H01L 2224/29344; H01L 2224/2939; H01L 2924/12042; H01L 2224/29357; H01L 2224/29347; H01L 2224/29082; H01L 2224/29076; H01L 2224/29083; H01L 2224/2919;
(Continued)

(56) References Cited

U.S. PATENT DOCUMENTS 6,225,206 B1 *   5/2001   Jimarez ................ B23K 1/0016
                                                    438/616
2006/0008626 A1 * 1/2006  Tam ....................... H05K 3/323
                                                    428/209

(Continued)

OTHER PUBLICATIONS

Lee et al., "Controlled Nanoparticle Assembly by Dewetting of Charged Polymer Solution", Mar. 2, 2004 (Year: 2004).*

*Primary Examiner* — Steven T Sawyer
(74) *Attorney, Agent, or Firm* — NSIP Law (57) ABSTRACT

The present invention discloses flip-chip bonding method using an anisotropic adhesive polymer. The method includes applying an adhesive polymer solution containing metal particles dispersed therein onto a circuit substrate to form an adhesive polymer layer such that the adhesive polymer layer covers the metal particles; drying the adhesive polymer layer; and positioning an electronic element to be electrically connected to the circuit substrate on the dried adhesive polymer layer and causing dewetting of the polymer from the metal particles.

9 Claims, 9 Drawing Sheets

(51) Int. Cl.
*C09J 11/04* (2006.01)
*C09J 201/00* (2006.01)

(52) U.S. Cl.
CPC .... *C09J 2301/416* (2020.08); *C09J 2400/143* (2013.01); *C09J 2400/16* (2013.01); *H05K 2201/023* (2013.01); *H05K 2201/10636* (2013.01); *H05K 2203/0278* (2013.01)

(58) Field of Classification Search
CPC .......... H01L 2224/83851; H01L 24/27; H01L 24/83; H01L 2224/29355; H01L 2924/181; H01L 2224/29339; H01L 2224/294; C08G 59/68; B32B 37/025; B32B 37/06; B32B 37/10; B32B 37/24; B32B 38/0008; B32B 2305/30; B32B 2037/243; B32B 2307/202; B32B 2457/00; Y10T 428/24521
See application file for complete search history.

(56) References Cited

U.S. PATENT DOCUMENTS

| | | | | |
|---|---|---|---|---|
| 2014/0141184 A1* | 5/2014 | Yoon | ................... | B81C 1/00103 |
| | | | | 428/34.1 |
| 2015/0214176 A1* | 7/2015 | Shinohara | ........... | B32B 38/0008 |
| | | | | 361/767 |
| 2019/0187336 A1* | 6/2019 | Masuda | ................... | G02B 1/14 |
| 2019/0256675 A1* | 8/2019 | Miyake | ................... | B32B 7/022 |
| 2019/0337262 A1* | 11/2019 | Tsu | ............................ | C08J 5/18 |
| 2020/0032422 A1* | 1/2020 | Lagaron | ............... | D01D 5/0084 |

* cited by examiner

METHOD FOR FLIP-CHIP BONDING USING ANISOTROPIC ADHESIVE POLYMER

CROSS-REFERENCE TO RELATED APPLICATION

This application claims a benefit under 35 U.S.C. § 119(a) of Korean Patent Application No. 10-2018-0101594 filed on Aug. 28, 2018 and Korean Patent Application No. 10-2019-0095118 filed on Aug. 5, 2019, on the Korean Intellectual Property Office, the entire disclosure of which is incorporated herein by reference for all purposes.

BACKGROUND

1. Field

The present disclosure relates to an anisotropic adhesive polymer and a bonding method of an electronic device using the same. More specifically, the present disclosure relates to an anisotropic adhesive ultra-thin polymer that can easily physically and electrically bond an electronic device to a substrate and a bonding method of the electronic device using the same.

2. Description of Related Art

Integration and performance improvement of various electronic elements have contributed greatly to miniaturization and performance development of electronic devices. Various methods and researches have been attempted to reliably connect miniaturized and integrated electronic elements to a circuit or a substrate. Metal wire bonding and flip-chip bonding are widely used as a general method for electrically connecting various electronic elements such as light emitting diodes and transistors to a metal pad of a substrate such as breadboard.

The metal wire bonding method is used when an electrode of the electronic element defines a top thereof. This method directly connects the electrode of the electronic element with the metal pad of the substrate using an apparatus that includes a capillary tube. In the metal wire bonding method, aluminum and gold are often used as materials of metal wires. This method is limited in its use due to complex processes, low throughput, and instability of metal wires.

The flip chip bonding method has recently been mainly used as an alternative method to the metal wire bonding method to solve the shortcomings of the metal wire bonding method. The flip chip bonding method is used when the electrode of the electronic element defines a bottom thereof. In the flip chip bonding method, a solder bump or anisotropic conductive film (ACF) is mainly used to connect the electronic element to the substrate. Specifically, the flip chip bonding method is to pattern the solder bump on the electrode of the electronic element or the metal pad of the substrate and to apply heat thereto to electrically connect the electronic element to the substrate or to apply heat and pressure to the ACF simultaneously to physically and electrically connect metal particles embedded in the polymer film to the electrode and substrate. This flip chip bonding method is most widely used at present. However, in this method, the solder bump should be patterned on the electrode and the ACF uses a separate film. Thus, a high pressure may be required for connecting the element and the substrate due to the thickness of the film, resulting in low yield and difficulty in a large area.

SUMMARY

This Summary is provided to introduce a selection of concepts in a simplified form that are further described below in the Detailed Description. This Summary is not intended to identify all key features or essential features of the claimed subject matter, nor is it intended to be used alone as an aid in determining the scope of the claimed subject matter.

A purpose of the present disclosure is to provide a new electronic element bonding method replacing a conventional flip-chip bonding method in which high pressure and high heat are simultaneously applied, thereby minimizing damage to the electronic element and substrate due to the high pressure and high heat and implementing a large area bonding easily and ultimately improving productivity and manufacturing reliability of the electronic element.

More specifically, the present disclosure aims to provide a bonding method for electrically connecting an electronic element to a substrate under low temperature and low pressure condition only via plating and simple heat treatment or simple pressurization of the electronic element.

Purposes of the present disclosure are not limited to the above-mentioned purpose. Other purposes and advantages of the present disclosure as not mentioned above may be understood from following descriptions and more clearly understood from embodiments of the present disclosure. Further, it will be readily appreciated that the purposes and advantages of the present disclosure may be realized by features and combinations thereof as disclosed in the claims.

In a first aspect of the present disclosure, there is provided a structure for flip-chip bonding, the structure allowing an adhesive polymer to be dewettted, the structure comprising: a circuit substrate; an anisotropic adhesive polymer layer applied on the circuit substrate; and metal particles dispersed in the adhesive polymer layer, wherein an effective interfacial potential of the adhesive polymer at a position corresponding to the metal particle has a metastable state, and the adhesive polymer at the position corresponding to the metal particle has a thickness change by an external force applied thereto, such that the adhesive polymer is dewetted from the metal particle.

In a second aspect of the present disclosure, there is provided a structure for flip-chip bonding, the structure allowing an adhesive polymer to be dewettted, the structure comprising: a circuit substrate; a relief electrode partially formed on the circuit substrate; and an anisotropic adhesive polymer layer applied on the circuit substrate and the relief electrode, wherein an effective interfacial potential of the adhesive polymer at a position corresponding to the relief electrode has a metastable state, and the adhesive polymer at the position corresponding to the relief electrode has a thickness change by an external force applied thereto, such that the adhesive polymer is dewetted from the relief electrode.

In one implementation of the first aspect or second aspect, the adhesive polymer is UV curable.

In one implementation of the first aspect or second aspect, a function of the effective interfacial potential is expressed as a following Equation 1:

$$\Phi(h) = \frac{c}{h^8} + \Phi_{vd}(h) = \frac{c}{h^8} - \frac{A}{12\pi h^2} \quad \langle \text{Equation 1} \rangle$$

wherein in the Equation 1, h represents a thickness of the polymer, c represents a short-range interaction strength between the polymer and the metal particle or the relief electrode, A represents an effective Hamaker constant of the metal particle or the relief electrode, $\Phi_{vd}(h)$ denotes a function of van der Waals force based on the thickness h, wherein c in the Equation 1 is obtained from a following Equation 2:

$$\Phi(h^*) = \frac{c}{h^{*8}} - \frac{A}{12\pi h^{*2}} = \sigma\left[1 - (1 + \tan^2\theta)^{-\frac{1}{2}}\right] \quad \langle \text{Equation 2} \rangle$$

wherein in the Equation 2, θ represents a contact angle between the metal particle or the relief electrode and the polymer, σ represents a surface tension of the polymer, h* denotes an equilibrium film thickness as a thickness of the polymer formed after the dewetting.

In one implementation of the first aspect or second aspect, in the metastable state, a value of the function of the effective interfacial potential changes from a negative value to a positive value as a value of h increases and, then, a slope of the function of the effective interfacial potential is changed to a negative value.

In one implementation of the first aspect or second aspect, a minimum thickness of the adhesive polymer at the position corresponding to the metal particle or the relief electrode is defined as a thickness thereof at which the slope of the effective interfacial potential of the adhesive polymer at the position corresponding to the metal particle or the relief electrode starts to change to a negative value.

In a third aspect of the present disclosure, there is provided a flip-chip bonding method comprising: providing the structure for flip-chip bonding as defined above; positioning an electronic element onto the adhesive polymer such that the electronic element faces the metal particle or the relief electrode, wherein an electronic element is to be electrically connected with the circuit substrate; and reducing a thickness of the adhesive polymer at a position corresponding to the metal particle or the relief electrode to allow the adhesive polymer to be dewetted from the metal particle or the relief electrode.

In one implementation of the third aspect, a function of the effective interfacial potential is expressed as a following Equation 1:

$$\Phi(h) = \frac{c}{h^8} + \Phi_{vd}(h) = \frac{c}{h^8} - \frac{A}{12\pi h^2} \quad \langle \text{Equation 1} \rangle$$

wherein in the Equation 1, h represents a thickness of the polymer, c represents a short-range interaction strength between the polymer and the metal particle or the relief electrode, A represents an effective Hamaker constant of the metal particle or the relief electrode, $\Phi_{vd}(h)$ denotes a function of van der Waals force based on the thickness h, wherein c in the Equation 1 is obtained from a following Equation 2:

$$\Phi(h^*) = \frac{c}{h^{*8}} - \frac{A}{12\pi h^{*2}} = \sigma\left[1 - (1 + \tan^2\theta)^{-\frac{1}{2}}\right] \quad \langle \text{Equation 2} \rangle$$

wherein in the Equation 2, θ represents a contact angle between the metal particle or the relief electrode and the polymer, σ represents a surface tension of the polymer, h* denotes an equilibrium film thickness as a thickness of the polymer formed after the dewetting.

In one implementation of the third aspect, in the metastable state, a value of the function of the effective interfacial potential changes from a negative value to a positive value as a value of h increases and, then, a slope of the function of the effective interfacial potential is changed to a negative value.

In one implementation of the third aspect, a minimum thickness of the adhesive polymer at the position corresponding to the metal particle or the relief electrode is defined as a thickness thereof at which the slope of the effective interfacial potential of the adhesive polymer at the position corresponding to the metal particle or the relief electrode starts to change to a negative value, wherein reducing the thickness of the adhesive polymer includes reducing the thickness of the adhesive polymer to a thickness smaller than the minimum thickness.

In one implementation of the third aspect, reducing the thickness of the adhesive polymer includes reducing the thickness of the adhesive polymer to a thickness smaller than the minimum thickness using an external force applied thereto.

In one implementation of the third aspect, the external force is applied via pressurization or warming.

In one implementation of the third aspect, the adhesive polymer is ultra-violet (UV) curable, wherein the method further include, after flip-chip bonding between the circuit substrate and the electronic element via the dewetting of the polymer, exposing and curing the UV curable polymer to UV rays.

In a fourth aspect of the present disclosure, there is provided a method for manufacturing a structure for flip-chip bonding, the structure allowing an adhesive polymer to be dewettted, the method comprising: providing a circuit substrate; applying an adhesive polymer solution containing metal particles dispersed therein onto the circuit substrate to form an adhesive polymer layer such that the adhesive polymer layer covers the metal particles; and drying the adhesive polymer layer, wherein an effective interfacial potential of the dried adhesive polymer at a position corresponding to the metal particle has a metastable state, and the dried adhesive polymer at the position corresponding to the metal particle has a thickness change by an external force applied thereto, such that the adhesive polymer is dewetted from the metal particle.

In a fifth aspect of the present disclosure, there is provided a method for manufacturing a structure for flip-chip bonding, the structure allowing an adhesive polymer to be dewettted, the method comprising: providing a circuit substrate; partially forming a relief electrode on the substrate; applying an adhesive polymer solution onto the circuit substrate and the relief electrode to form an adhesive polymer layer such that the adhesive polymer layer covers the relief electrode; and drying the adhesive polymer layer, wherein an effective interfacial potential of the dried adhesive polymer at a position corresponding to the relief electrode has a metastable state, and the adhesive polymer at the position corresponding to the relief electrode has a thickness change by an external force applied thereto, such that the adhesive polymer is dewetted from the relief electrode.

In one implementation of the fourth or fifth aspect, a function of the effective interfacial potential is expressed as a following Equation 1:

$$\Phi(h) = \frac{c}{h^8} + \Phi_{vd}(h) = \frac{c}{h^8} - \frac{A}{12\pi h^2} \qquad \text{<Equation 1>}$$

wherein in the Equation 1, h represents a thickness of the polymer, c represents a short-range interaction strength between the polymer and the metal particle or the relief electrode, A represents an effective Hamaker constant of the metal particle or the relief electrode, $\Phi_{vd}(h)$ denotes a function of van der Waals force based on the thickness h, wherein c in the Equation 1 is obtained from a following Equation 2:

$$\Phi(h^*) = \frac{c}{h^{*8}} - \frac{A}{12\pi h^{*2}} = \sigma\left[1 - (1+\tan^2\theta)^{-\frac{1}{2}}\right] \qquad \text{<Equation 2>}$$

wherein in the Equation 2, θ represents a contact angle between the metal particle or the relief electrode and the polymer, σ represents a surface tension of the polymer, h* denotes an equilibrium film thickness as a thickness of the polymer formed after the dewetting.

In one implementation of the fourth or fifth aspect, in the metastable state, a value of the function of the effective interfacial potential changes from a negative value to a positive value as a value of h increases and, then, a slope of the function of the effective interfacial potential is changed to a negative value.

In one implementation of the fourth or fifth aspect, a minimum thickness of the adhesive polymer at the position corresponding to the metal particle or the relief electrode is defined as a thickness thereof at which the slope of the effective interfacial potential of the adhesive polymer at the position corresponding to the metal particle or the relief electrode starts to change to a negative value.

In a sixth aspect of the present disclosure, there is provided a flip-chip bonding method using an anisotropic adhesive polymer, wherein the method includes applying an adhesive polymer solution containing metal particles dispersed therein onto a circuit substrate to form an adhesive polymer layer such that the adhesive polymer layer covers the metal particles; drying the adhesive polymer layer; and positioning an electronic element to be electrically connected to the circuit substrate on the dried adhesive polymer layer and causing dewetting of the polymer from the metal particles.

In accordance with the present disclosure, the polymer portion at the metal particle position or relief electrode position may be formed in the metastable state and in a thickness variable state in relation to the metal particle when the polymer is formed on the circuit substrate. For example, in consideration of van der Waals forces, surface tension, and contact angle between the polymer portion and the metal particle or relief electrode, the polymer may be configured and dried to a metastable state. Thus, the flip-chip bonding of the electronic element to the substrate may be ready. Then, after flip-chip bonding the electronic element to the substrate, dewetting of the polymer portion is induced only by light pressurization and low temperature heating to change the thickness so that the dewetting occurs. In this way, the metal particle or relief electrode and the electronic element may come into contact with the circuit substrate to achieve the flip-chip bonding.

Effects of the present disclosure are as follows but are not limited thereto.

According to the anisotropic adhesive polymer ultra-thin film and the bonding method of the electronic element using the same of the present disclosure as described above, the plating of the electronic element and simple heat treatment or simple pressurization thereof allow the electronic element and the substrate to be electrically connected to each other under the low and low pressure condition. Therefore, this novel method may replace the conventional flip-chip bonding method in which the high pressure and high temperature are applied at the same time, thereby minimizing damage to the electronic element and substrate due to high pressure and high temperature, and implementing a large area bonding easily and ultimately improving productivity and manufacturing reliability of the electronic element.

In addition to the effects as described above, specific effects of the present disclosure are described together with specific details for carrying out the invention.

BRIEF DESCRIPTION OF THE DRAWINGS

The accompanying drawings, which are incorporated in and form a part of this specification and in which like numerals depict like elements, illustrate embodiments of the present disclosure and, together with the description, serve to explain the principles of the disclosure.

DETAILED DESCRIPTIONS

For simplicity and clarity of illustration, elements in the figures are not necessarily drawn to scale. The same reference numbers in different figures denote the same or similar elements, and as such perform similar functionality. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1A:
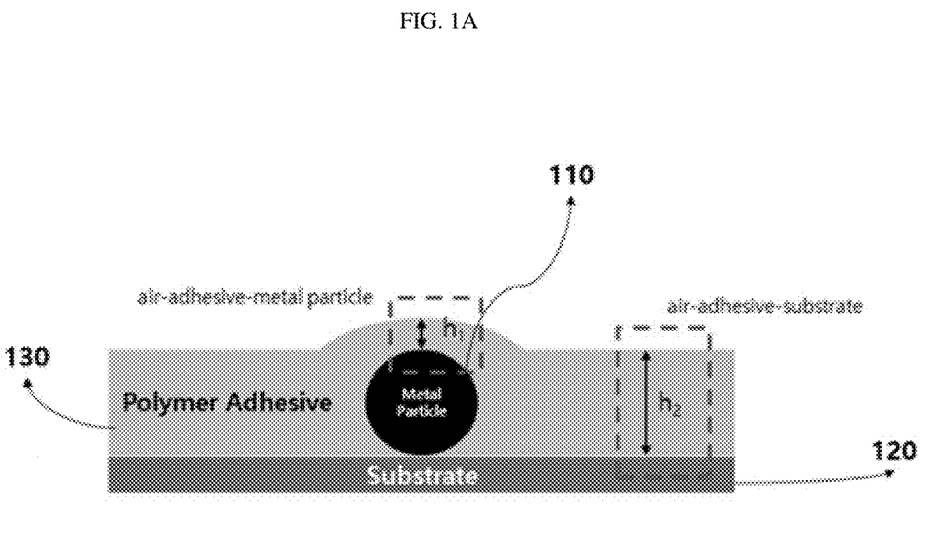
FIGS. 1A and 1B illustrate a structure for a flip-chip bonding in which an anisotropic adhesive polymer is dewetted according to an embodiment of the present disclosure.
Figure 1B:
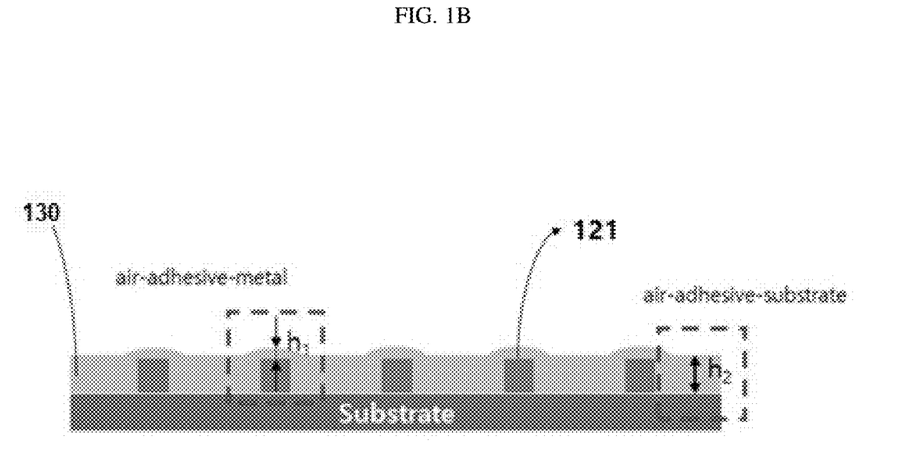

FIGS. 1A and 1B illustrate a structure for a flip-chip bonding in which an anisotropic adhesive polymer is dewetted according to an embodiment of the present disclosure.

FIG. 1A, shows that an adhesive polymer 130 in which metal particles 110 are dispersed is applied on a circuit substrate 120. FIG. 1B shows that the circuit substrate has a relief 121 and the polymer 130 is applied thereon.

In order to form FIG. 1A, in one example, an adhesive polymer solution in which metal particles 110 are dispersed is applied onto a circuit substrate to form an adhesive polymer layer having a polymer thickness so that the adhesive polymer layer covers the metal particles, i.e. the metal particles are not exposed. Then, the adhesive polymer layer is dried while for example, spin coating the adhesive polymer solution on the substrate to a desired thickness (in this step, the adhesive polymer covers the metal particles).

Further, in order to form FIG. 1B, an adhesive polymer layer may cover a relief electrode by applying an adhesive polymer solution onto the circuit substrate with the relief electrode. Then, the adhesive polymer layer may be dried to cover the relief electrode.

In this connection, the polymer type and a thickness ($h_1$) of the polymer layer on the metal particle and a thickness ($h_2$) of the polymer layer on the substrate may be determined in consideration of van der Waals forces, surface tension, and contact angle between the polymer and the metal particle or the substrate such that the polymer has a metastable state of the effective interfacial potential at the metal particle location (the location of the air-adhesive polymer-metal particle in FIGS. 1A and 1B, the thickness ($h_1$) in FIGS. 1A and 1B), and has a metastable state or stable state of the effective interfacial potential at the substrate position (free of the metal particles, at the location of the air-adhesive-substrate, the thickness ($h_2$) in FIGS. 1A-1B). In this connection, the polymer thickness h2 at the substrate is larger than the polymer thickness h1 at the metal particle position.

In this connection, the stable state of the effective interfacial potential means a state in which dewetting does not occur even with a change in the thickness of the polymer. The unstable state of the effective interfacial potential refers to the state where dewetting occurs spontaneously regardless of the thickness change. The metastable state of the effective interfacial potential refers to the state in which dewetting may occur due to a change in thickness.

Figure 2:
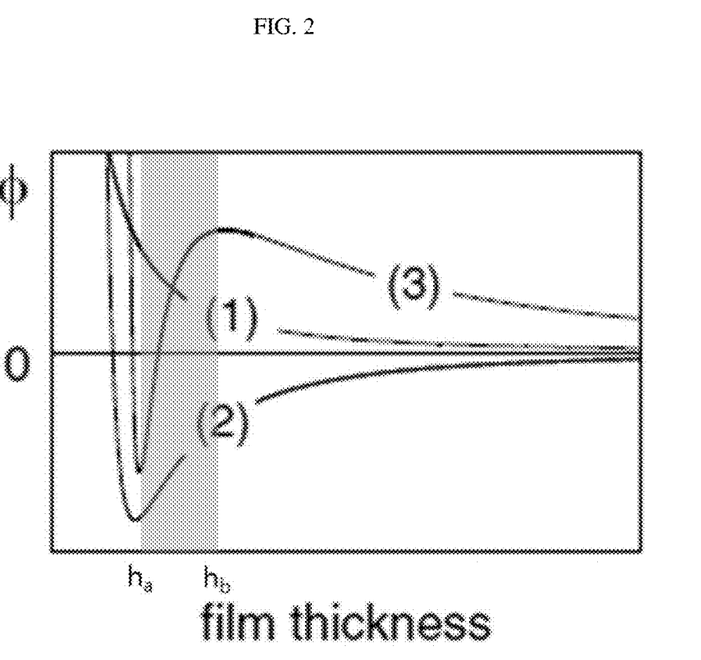
FIG. 2 shows an effective interfacial potential function based on a thickness at stable, unstable and metastable states of the effective interfacial potential.

The three states of this effective interfacial potential may be represented using the graph in FIG. 2. FIG. 2 shows an effective interfacial potential function based on a thickness at stable, unstable and metastable states of the effective interfacial potential. In this connection, the effective interfacial potential may be expressed by a following Equation 1.

$$\Phi(h) = \frac{c}{h^8} + \Phi_{vd}(h) = \frac{c}{h^8} - \frac{A}{12\pi h^2} \qquad \text{<Equation 1>}$$

In the Equation 1, h represents a thickness of the polymer, c represents a short-range interaction strength between the polymer and the metal particle or the relief electrode. A represents an effective Hamaker constant of the metal particle or the relief electrode. $\Phi_{vd}(h)$ refers to a function of van der Waals forces based on the thickness h.

Based on the Equation 1, the effective interfacial potential at the metal particle position ($h_1$) is given by a following Equation 1 of the $h_1$, while the effective interfacial potential at the substrate position ($h_2$) is given by a following Equation 3 of the $h_2$.

$$\Phi(h) = \frac{c_{metal}}{h_1^8} - \frac{A_{metal}}{12\pi h_1^2} \qquad \text{<Equation 1 of } h_1\text{>}$$

$$\Phi(h) = \frac{c_{substrate}}{h_2^8} - \frac{A_{substrate}}{12\pi h_2^2} \qquad \text{<Equation 1 of } h_2\text{>}$$

c in the Equation 1 may be obtained from a following Equation 2.

$$\Phi(h^*) = \frac{c}{h^{*8}} - \frac{A}{12\pi h^{*2}} = \sigma\left[1 - (1 + \tan^2\theta)^{-\frac{1}{2}}\right] \qquad \text{(Equation 2)}$$

In the Equation 2, θ represents a contact angle between the metal particle and the polymer. σ represents a surface tension of the polymer. h* denotes an equilibrium film thickness, which is a thickness of the polymer formed after the dewetting.

All values except c can be obtained. The equilibrium film thickness (h*) may be measured using X-ray reflectivity. Finally, c may be obtained using the Equation 2.

Using c obtained using the Equation 2, the effective interfacial potential function according to the thickness at the stable state, the unstable state, and the metastable state for the Equation 1 may be expressed as shown in FIG. 2. (1) in FIG. 2 is a graph of the stable state, (2) is a graph of the unstable state, and (3) is a graph of the metastable state.

In the metastable state, a value of the function of the effective interfacial potential may vary from a negative value to a positive value as the value of h increases and, then, a slope of the function of the effective interfacial potential is changed to a negative value. In the stable state, the function of the effective interfacial potential has a positive value when the h value increases.

Referring to FIG. 2, in the unstable state graph (2), spinodal dewetting occurs when a thickness is larger than a thickness ($h_a$) at the lowest state of the effective interfacial potential of the film. When the thickness is larger than the $h_a$ thickness, an unstable state is always maintained where the potential $\Phi(h)<0$.

In addition, in the stable state represented by (1) in the graph of FIG. 2, $\Phi(h)>0$ regardless of the thickness. The larger the thickness (h), the lower the effective interfacial potential, such that the stable state is maintained and thus the dewetting does not occur.

In the metastable state $\Phi(h)\approx 0$, metastable) represented by (3) in the graph in FIG. 2, heterogeneous nucleation and dewetting occur when the thickness (h) is larger than a thickness ($h_a$) in the lowest state of the effective interfacial potential and is smaller than a certain thickness ($h_b$) (a point of inflection of the slope, where the slope of the effective interfacial potential function is zero). Further, when the thickness (h) is larger than the certain thickness ($h_b$), dewetting does not occur and a stable polymer is maintained.

In accordance with the present disclosure, the polymer at the location of the metal particle exhibits the metastable state defined in relation to the metal particle. For example, the polymer that exhibits the behavior shown in FIG. 2 (3) may be selected in consideration of van der Waals forces, surface tensions, and contact angles between the polymer and the metal particle.

In accordance with the present disclosure, the polymer at the substrate location preferably exhibits the stable state defined in relation to the substrate or the metastable state above defined. That is, the polymer at the substrate location preferably exhibits the metastable state at a sufficiently large thickness greater than or equal to $h_b$, for example, has a thickness change that may be achieved by an applicable external force during use.

A minimum thickness of the dried adhesive polymer at the metal particle position may be a thickness at which the slope of the effective interfacial potential at the metal particle position is changed to a negative value. That is, in the graph (3) of FIG. 2, $h_b$ is the minimum thickness. The thickness of the polymer is preferably larger than $h_b$ and is smaller than $h_b$ plus a thickness of a size at which the thickness change may be achieved via the external force to be applied to flip-chip bonding.

Figure 3:
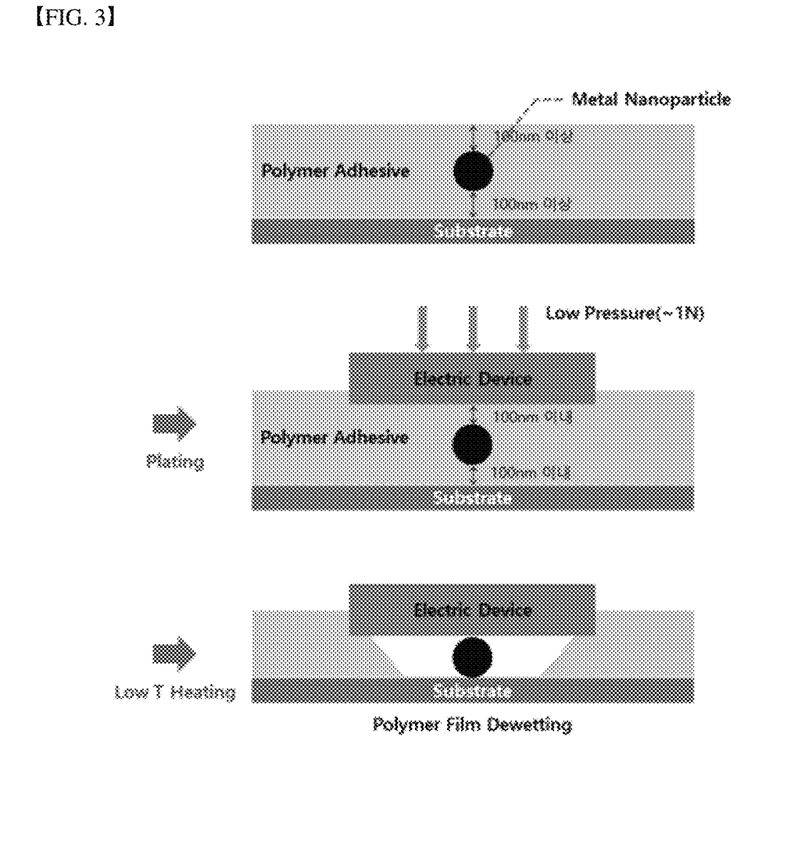
FIG. 3 is a diagram illustrating a bonding method between a substrate and an electronic element using an anisotropic adhesive polymer according to another embodiment of the present disclosure.

As illustrated in FIG. 3, after setting the thickness of the polymer at the metal particle position to $h_b$ or greater, the electronic element is positioned ono the polymer. Then, a weak external force such as 1N may be applied to the element to change the polymer thickness at the metal particle position to a thickness smaller than the minimum thickness ($h_b$). Thus, the polymer at the metal particle position will be dewetted. In turn, the electronic element and the circuit substrate are electrically connected to each other and the electronic element is fixed by the adhesive polymer.

That is, a thickness of the polymer at the metal particle location which is in the metastable state becomes smaller than the minimum thickness due to simple pressurization (hand pressing force or 1N or smaller) or warming (for example, temperature below 100° C.) after positioning of the electronic element on the polymer. Thus, the thickness of the polymer at the metal particle location becomes smaller such that the polymer is brought into the unstable state, thereby causing dewetting of the polymer.

In one embodiment, the polymer may be coated to have a thickness of 100 nm to 500 nm. A diameter of the metal particle or a relief height of the relief electrode may be between 50 nm and 300 nm.

In one embodiment, the polymer may be a curable polymer. Preferably, the polymer may be an ultraviolet curable polymer. The polymer may lose adhesion via curing. At this time, the electronic element contacts the metal particle or the relief electrode when the anisotropic adhesive polymer in accordance with the present disclosure is dewetted. When ultraviolet rays are irradiated, the ultraviolet rays are not transmitted to a region where the electronic element is disposed, the adhesive power remains in that region. The adhesive force of the polymer is lost by the ultraviolet rays in a region where the electronic element is not disposed.

In one embodiment, the anisotropic adhesive polymer may be dewetted from the metal particle or relief electrode via heat treatment at a temperature below or equal to 100° C. and/or pressurization at a pressure below or equal to 1 N.

Example 1

Actually, the adhesive polymer in the metastable state was not spontaneously dewetted in a prepared state. The dewetting occurs only through the pressurization, thereby to expose the metal nanoparticles (indium nanoparticles) and relief electrode (gold). This dewetting and the resulting exposure were checked as follows.

As an anisotropic adhesive polymer in accordance with the present disclosure, bisphenol A based adhesive polymer solution was prepared. The adhesive polymer solution contains monomers in anhydrous ethanol solvent (Bisphenol A glycerolate diacrylate), crosslinking agent (MPS, 3-(trimethoxysilyl) propyl methacrylate), Spin-on-Glass (SOG), photo-initiator (benzyl-2-(dimethylamino)-4'-mopholinobutyrophenone).

The surface tension of this polymer and the contact angle between this polymer and the indium and gold were determined as follows.

TABLE 1

|  | Contact angle Θ (degrees) | | Cosine θ of contact angle | | Contact angle unit (mJ * m$^{-2}$) $\gamma_s^d$ | Contact angle unit (mJ * m$^{-2}$) $\gamma_s^p$ | Contact angle unit (mJ * m$^{-2}$) $\gamma_s$ |
|  | Ultrapure water (DI water) | Ethylene glycol | DI water | Ethylene glycol | | | |
| --- | --- | --- | --- | --- | --- | --- | --- |
| Example Polymer | 75.675° | 47.92° | 0.247422 | 0.670168 | 24.4279778 | 9.254093238 | 33.68207103 |
| Substrate (glass) | 23.2° | 31.4° | 0.919135 | 0.853551 | 0.300481449 | 92.46907051 | 92.76955196 |
| Gold | 67.37° | 54.13° | 0.384779 | 0.585948 | 8.090467587 | 27.30580895 | 35.39627654 |
| Indium | 84° | 67.6° | 0.104528 | 0.381070 | 11.64668026 | 11.34120052 | 22.98788077 |

Contact angles [Θ] between ultrapure water and ethylene glycol and the example polymer, glass, gold and indium were measured. The measurement is shown in Table 1.

$$\gamma_S = \gamma_{SL} + \gamma_L \cos\theta \quad \text{(Equation 3)}$$

$$\gamma_i = \gamma_i^d + \gamma_i^p \quad \text{(Equation 4)}$$

$$\gamma_{SL} = \gamma_S + \gamma_L - 2(\gamma_s^d \gamma_L^d)^{1/2} - 2(\gamma_S^p \gamma_L^p)^{1/2} \quad \text{(Equation 5)}$$

$$\gamma_L(1+\cos\theta) = 2(\gamma_s^d \gamma_L^d)^{1/2} + 2(\gamma_S^p \gamma_L^p)^{1/2} \quad \text{(Equation 6)}$$

We may achieve the Equation (6) by combining the equations (3) to (5). In this case, a surface tension of a solid material may be obtained by measuring contact angles between the solid material and two liquids (ultra-pure water and ethyl glycol) whose surface tension are known relative to the solid material. Using this method, surface tensions of the polymer adhesive, indium and gold were obtained. The surface tensions thereof are listed in the Table 1.

Similarly, the contact angle between indium-polymer or gold-polymer was determined using the surface tensions of polymer, indium and gold as follows:
Indium-polymer contact angle: 29.8171°
Gold-polymer contact angle: 38.862°

The example polymer was applied to a glass substrate. The coating thickness of the polymer containing the indium particles dispersed therein was about 500 nm. The coating thickness of the polymer on the gold relief electrode was about 1 μm. The size of each of the indium particles was about 250 nm. The height of the relief electrode was about 400 nm. Therefore, the polymer thickness at the metal particle position is about 250 nm. The thickness of the polymer on the relief electrode was about 600 nm. In this case, the polymer was not spontaneously dewetted.

Figure 5:
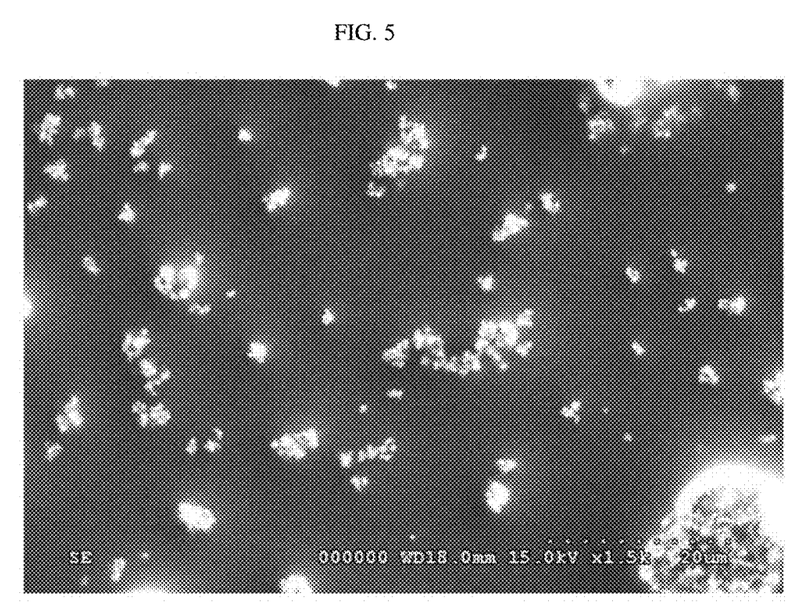
FIG. 5 shows an SEM image in which the indium particle is exposed via dewetting of the polymer in Example 1 of the present disclosure.
Figure 6A:
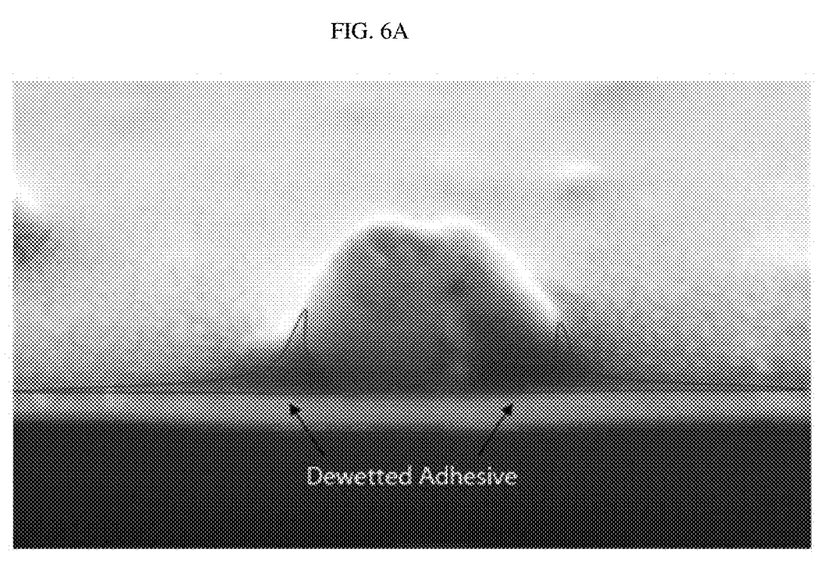
FIGS. 6A and 6B show a state after the dewetting in Example 1 of the present disclosure.
Figure 6B:
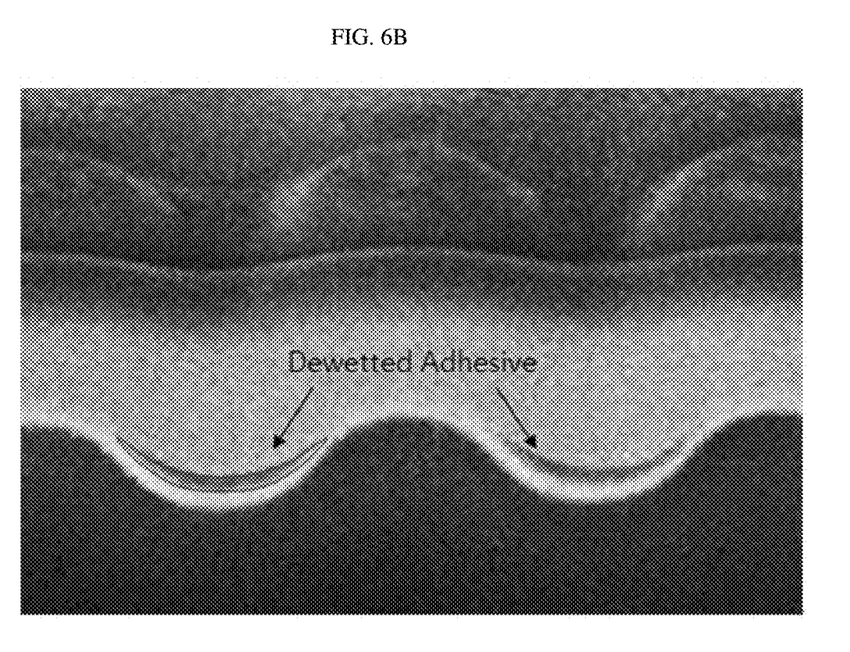

We pressed the polymer using a finger lightly. Thus, it was confirmed that the polymer was dewetted at the indium particle position and the electrode relief position. FIG. 5 shows a SEM image of the indium particles exposed by the dewetting in Example 1 of the present disclosure. FIGS. 6A and 6B are photographs after dewetting in Example 1 of the present disclosure. It was confirmed that the dewetted polymer was collected in a crescent shape around the indium particles and the relief electrode as shown in FIG. 6A and FIG. 6B, respectively.

The equilibrium film thickness (h*) of the dewetted polymer was measured. The equilibrium film thickness (h*) of the dewetted polymer at a position corresponding to indium was 4 nm. The equilibrium film thickness (h*) of the dewetted polymer at a position corresponding to gold was 5 nm. The effective Hamaker constant of indium is $3.0^{-19}$ J. The effective Hamaker constant for gold is $4.5^{-19}$ J.

Using Equation 2 below, the value of c was obtained using the obtained contact angles. The c value for indium was $5.31^{-78}$ J and the c value for gold was $3.82^{-77}$ J.

$$\Phi(h^*) = \frac{c}{h^{*8}} - \frac{A}{12\pi h^{*2}} = \sigma\left[1 - (1 + \tan^2\theta)^{-\frac{1}{2}}\right] \quad \text{(Equation 2)}$$

Using Equation 1 below, the effective interfacial potential of the polymer of Example 1 was obtained. The results are shown in FIGS. 4A-4D.

$$\Phi(h) = \frac{c}{h^8} + \Phi_{vd}(h) = \frac{c}{h^8} - \frac{A}{12\pi h^2} \quad \text{(Equation 1)}$$

Figure 4A:
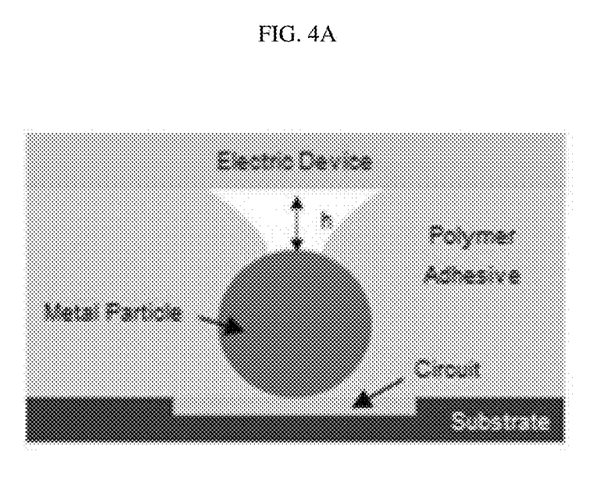
FIGS. 4A-4D show an effective interfacial potential function of the anisotropic adhesive polymer with respect to an indium particle and a gold electrode in Example 1 of the present disclosure.
Figure 4B:
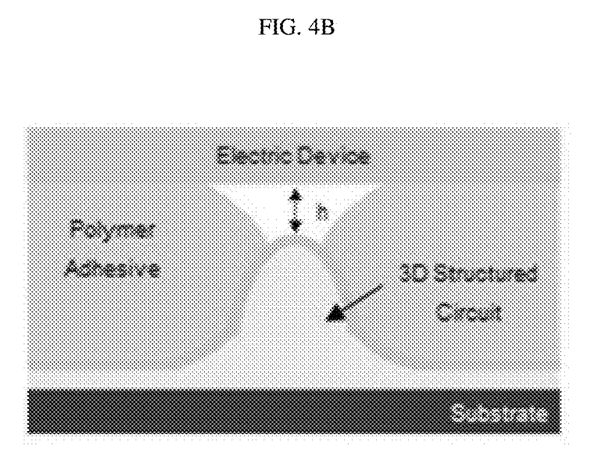
Figure 4C:
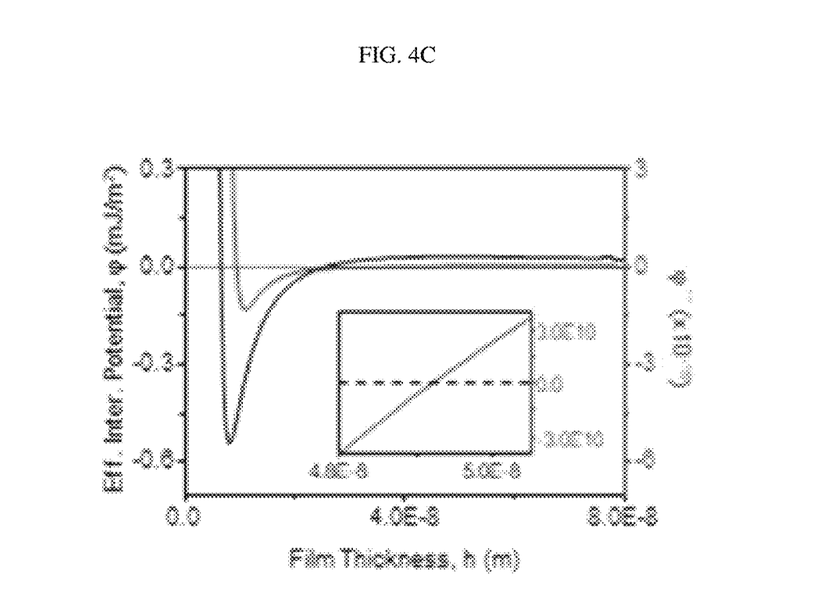
Figure 4D:
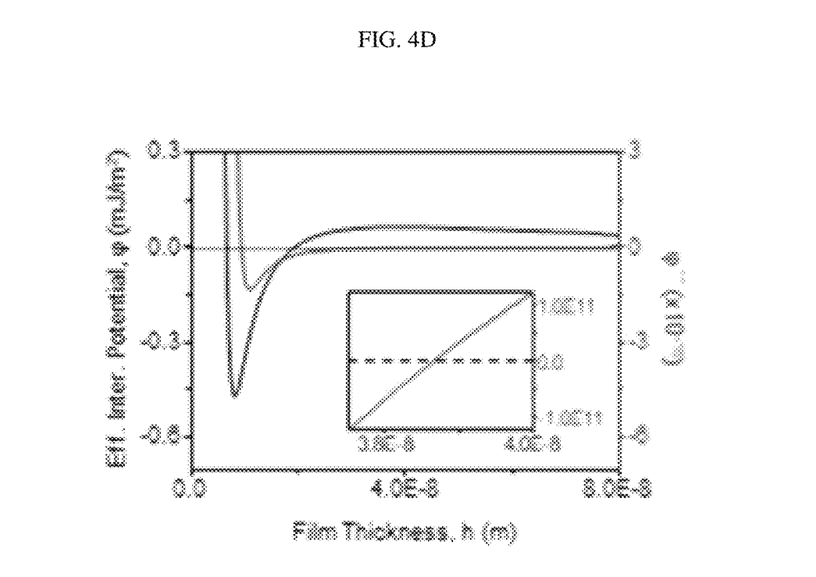

In FIG. 4A, an upper left drawing shows the dewetting of the polymer of Example 1 of the present disclosure from the indium particles. An upper right drawing shows the dewetting of the polymer of Example 1 of the present disclosure from the gold relief electrode. Graphs at the bottom left (FIG. 4C) and bottom right (FIG. 4D) indicate the effective potential values (black) and their second derivative functions (red) for Indium and Gold in Example 1, respectively. According to those graphs, when the thickness of the adhesive polymer is about 49 nm or smaller, the dewetting of the polymer occurs spontaneously in relation to the indium particles. When the thickness of the adhesive polymer is about 38.5 nm or smaller, the dewetting of the polymer occurs spontaneously in relation to gold.

The preceding Example 1 and results thereof confirm that the polymer of Example 1 of the present disclosure exhibits the behavior of the metastable state of the effective interfacial potential. It was also found that in an initial thickness of the polymer, the effective interfacial potential has the stable state and then the dewetting of the polymer occurs due to the thickness change thereof resulting from small external force applied thereto.

Although the present disclosure has been described with reference to the drawings illustrating the present disclosure, the present disclosure is not limited to the embodiments and drawings disclosed in the present specification. It will be apparent that various modifications may be made by those skilled in the art within the scope of the present disclosure. In addition, it should be appreciated that effects to be achieved from configurations of the present disclosure as not expressly mentioned may be acknowledged.

What is claimed is:

1. A structure for flip-chip bonding, comprising:
   a circuit substrate;
   an anisotropic adhesive polymer layer disposed on the circuit substrate, the anisotropic adhesive polymer layer having an interface location; and
   a metal particle entirely covered by the anisotropic adhesive polymer layer to thereby form an air-adhesive-metal location at the interface location with a thickness of the anisotropic adhesive polymer layer covering the metal particle between the metal particle and air,
   wherein, at the interface location, the anisotropic adhesive polymer layer has an effective interfacial potential in a metastable state, such that the anisotropic adhesive polymer layer is spinodally dewetted from the metal particle upon reduction of the thickness of the anisotropic polymer layer covering the metal particle,
   wherein the anisotropic adhesive polymer layer is coated to have a thickness of 100 nm to 500 nm, and a diameter of the metal particle is 50 nm to 300 nm,
   wherein a function of the effective interfacial potential is expressed as a following Equation 1:

$$\Phi(h) = \frac{c}{h^8} + \Phi_{vd}(h) = \frac{c}{h^8} - \frac{A}{12\pi h^2} \quad <\text{Equation 1}>$$

wherein in the Equation 1, h represents the thickness of the anisotropic adhesive polymer layer covering the metal particle, c represents a short-range interaction strength between the anisotropic adhesive polymer layer and the metal particle, A represents an effective Hamaker constant of the metal particle, $\Phi_{vd}$(h) denotes a function of van der Waals force based on the thickness h, wherein c in the Equation 1 is obtained from a following Equation 2:

$$\Phi(h^*) = \frac{c}{h^{*8}} - \frac{A}{12\pi h^{*2}} = \sigma\left[1 - (1 + \tan^2\theta)^{-\frac{1}{2}}\right] \qquad \text{<Equation 2>}$$

wherein in the Equation 2, θ represents a contact angle between the metal particle and the anisotropic adhesive polymer layer, σ represents a surface tension of the anisotropic adhesive polymer layer, and h* denotes an equilibrium film thickness of the anisotropic adhesive polymer layer as a thickness that is formed by a spinodal dewetting, wherein, in the metastable state, a value of the function of the effective interfacial potential changes from a negative value to a positive value as a value of h increases and, then, a slope of the function of the effective interfacial potential is changed to a negative value, and wherein a minimum thickness of the adhesive polymer layer at the interface location is defined as the thickness h at which the slope of the function of the effective interfacial potential changes from positive to negative.

2. The structure for flip-chip bonding of claim 1, wherein the anisotropic adhesive polymer layer is UV curable.

3. A structure for flip-chip bonding, comprising:
a circuit substrate;
a relief electrode partially formed on the circuit substrate; and
an anisotropic adhesive polymer layer disposed on the circuit substrate and entirely covering the relief electrode with a thickness of the anisotropic adhesive polymer layer,
wherein, in the locality of the relief electrode, the anisotropic adhesive polymer layer has an effective interfacial potential in a metastable state, such that the anisotropic adhesive polymer layer is spinodally dewetted from the relief electrode upon reduction the thickness of the anisotropic polymer layer covering the relief electrode,
wherein the anisotropic adhesive polymer layer is coated to have a thickness of 100 nm to 500 nm, and a relief height of the relief electrode is 50 nm to 300 nm,
wherein a function of the effective interfacial potential is expressed as a following Equation 1:

$$\Phi(h) = \frac{c}{h^8} + \Phi_{vd}(h) = \frac{c}{h^8} - \frac{A}{12\pi h^2} \qquad \text{<Equation 1>}$$

wherein in the Equation 1, h represents the thickness of the p anisotropic adhesive polymer layer covering the relief electrode, c represents a short-range interaction strength between the anisotropic adhesive polymer layer and the relief electrode, A represents an effective Hamaker constant of the relief electrode, $\Phi_{vd}(h)$ denotes a function of van der Waals force based on the thickness h, wherein c in the Equation 1 is obtained from a following Equation 2:

$$\Phi(h^*) = \frac{c}{h^{*8}} - \frac{A}{12\pi h^{*2}} = \sigma\left[1 - (1 + \tan^2\theta)^{-\frac{1}{2}}\right] \qquad \text{<Equation 2>}$$

wherein in the Equation 2, θ represents a contact angle between the relief electrode and the anisotropic adhesive polymer layer, σ represents a surface tension of the anisotropic adhesive polymer layer, and h* denotes an equilibrium film thickness of the anisotropic adhesive polymer layer as a thickness that is formed by the spinodal dewetting, wherein, in the metastable state, a value of the function of the effective interfacial potential changes from a negative value to a positive value as a value of h increases and, then, a slope of the function of the effective interfacial potential is changed to a negative value, and wherein a minimum thickness of the anisotropic adhesive polymer layer at the interface location is defined as the thickness h at which the slope of the function of the effective interfacial potential changes from positive to negative.

4. The structure for flip-chip bonding of claim 3, wherein the anisotropic adhesive polymer layer is UV curable.

5. A structure for flip-chip bonding, comprising:
a circuit substrate having a surface;
an anisotropic adhesive polymer layer disposed on the surface of the circuit substrate, the anisotropic adhesive polymer layer having a first interface location and a second interface location; and
a metal conductor disposed on the surface of the circuit substrate and separated from air by a first thickness of the anisotropic adhesive polymer layer to thereby form an air-adhesive-metal location at the first interface location,
wherein the surface of the circuit substrate is separated from air by a second thickness of the anisotropic adhesive polymer layer to thereby form an air-adhesive-substrate location at the second interface location,
wherein, at the first interface location, the anisotropic adhesive polymer layer has an effective interfacial potential in a metastable state, such that the anisotropic adhesive polymer layer has a property to be dewetted from the metal conductor in response to a stimulus effective to reduce the first thickness of the anisotropic polymer layer covering the metal conductor and the second thickness of the anisotropic polymer layer covering the substrate, and
wherein, at the second interface location, the anisotropic adhesive polymer layer has an effective interfacial potential in a metastable state or in a stable state, such that the anisotropic adhesive polymer layer has a property to remain spread on the surface of the circuit substrate in response to a stimulus effective to reduce the first thickness of the anisotropic polymer layer covering the metal conductor and the second thickness of the anisotropic polymer layer covering the substrate,
wherein the anisotropic adhesive polymer layer is coated to have a thickness of 100 nm to 500 nm, and a thickness of the metal conductor is 50 nm to 300 nm,
wherein a function of the effective interfacial potential is expressed as a following Equation 1:

$$\Phi(h) = \frac{c}{h^8} + \Phi_{vd}(h) = \frac{c}{h^8} - \frac{A}{12\pi h^2} \qquad \text{<Equation 1>}$$

wherein in the Equation 1, h represents the thickness of the anisotropic adhesive polymer layer covering the metal conductor, c represents a short-range interaction strength between the anisotropic adhesive polymer layer and the metal conductor, A represents an effective Hamaker constant of the metal conductor, $\Phi_{vd}$ (h) denotes a function of van der Waals force based on the thickness h, wherein c in the Equation 1 is obtained from a following Equation 2:

$$\Phi(h^*) = \frac{c}{h^{*8}} - \frac{A}{12\pi h^{*2}} = \sigma\left[1 - (1+\tan^2\theta)^{-\frac{1}{2}}\right] \quad <\text{Equation 2}>$$

wherein in the Equation 2, θ represents a contact angle between the metal conductor and the anisotropic adhesive polymer layer, σ represents a surface tension of the anisotropic adhesive polymer layer, and h* denotes an equilibrium film thickness of the anisotropic adhesive polymer layer as a thickness that is formed by the spinodal dewetting, wherein, in the metastable state, a value of the function of the effective interfacial potential changes from a negative value to a positive value as a value of h increases and, then, a slope of the function of the effective interfacial potential is changed to a negative value, and wherein a minimum thickness of the adhesive polymer layer at the interface location is defined as the thickness h at which the slope of the function of the effective interfacial potential changes from positive to negative.

6. A flip-chip structure, comprising:
a circuit substrate having an adhesion region and an exposure region;
an electronic element adhered to the circuit substrate in the adhesion region of the circuit substrate by an anisotropic adhesive polymer layer, at least a portion of the anisotropic adhesive polymer layer being in a metastable state; and
a metal conductor disposed between the circuit substrate and the electronic element, the exposure region of the circuit substrate conforming to a shape of the metal conductor, the shape corresponding to a dewetting of the metastable state of the anisotropic adhesive polymer layer,
wherein a surface of the metal conductor and a surface of the circuit substrate are exposed to air in the exposure region, and
wherein the metal conductor directly contacts the electronic element,
wherein the anisotropic adhesive polymer layer is coated to have a thickness of 100 nm to 500 nm, and a thickness of the metal conductor is 50 nm to 300 nm,
wherein a function of the effective interfacial potential is expressed as a following Equation 1:

$$\Phi(h) = \frac{c}{h^8} + \Phi_{vd}(h) = \frac{c}{h^8} - \frac{A}{12\pi h^2} \quad <\text{Equation 1}>$$

wherein in the Equation 1, h represents the thickness of the anisotropic adhesive polymer layer covering the metal conductor, c represents a short-range interaction strength between the anisotropic adhesive polymer layer and the metal conductor, A represents an effective Hamaker constant of the metal conductor, $\Phi_{vd}$ (h) denotes a function of van der Waals force based on the thickness h, wherein c in the Equation 1 is obtained from a following Equation 2:

$$\Phi(h^*) = \frac{c}{h^{*8}} - \frac{A}{12\pi h^{*2}} = \sigma\left[1 - (1+\tan^2\theta)^{-\frac{1}{2}}\right] \quad <\text{Equation 2}>$$

wherein in the Equation 2, θ represents a contact angle between the metal conductor and the anisotropic adhesive polymer layer, σ represents a surface tension of the anisotropic adhesive polymer layer, and h* denotes an equilibrium film thickness of the anisotropic adhesive polymer layer as a thickness that is formed by the spinodal dewetting, wherein, in the metastable state, a value of the function of the effective interfacial potential changes from a negative value to a positive value as a value of h increases and, then, a slope of the function of the effective interfacial potential is changed to a negative value, and wherein a minimum thickness of the adhesive polymer layer at the interface location is defined as the thickness h at which the slope of the function of the effective interfacial potential changes from positive to negative.

7. The flip-chip structure of claim 6, wherein the exposure region is at least partially surrounded by the adhesion region.

8. The structure for flip-chip bonding of claim 1, wherein, at the interface location, the anisotropic adhesive polymer layer is sensitive to an external pressurization force that is below or equal to 1N and that is effective to reduce the thickness of the anisotropic polymer layer covering the metal particle, such that the anisotropic adhesive polymer layer is spinodally dewetted from the metal particle upon application of the external pressurization force.

9. The structure for flip-chip bonding of claim 1, wherein, at the interface location, the anisotropic adhesive polymer layer is sensitive to heat treatment below or equal to 100° C., such that the anisotropic adhesive polymer layer is spinodally dewetted from the metal particle upon application of the heat treatment.

* * * * *